United States Patent [19]
Ryou

[11] Patent Number: 5,770,464
[45] Date of Patent: Jun. 23, 1998

[54] METHOD FOR FABRICATING SEMICONDUCTOR DEVICES HAVING LIGHTLY DOPED DRAIN

[75] Inventor: Eui Kyu Ryou, Kyoungki-do, Rep. of Korea

[73] Assignee: Hyundai Electronics Industriers Co., Ltd., Kyoungki-do, Rep. of Korea

[21] Appl. No.: 365,954

[22] Filed: Dec. 29, 1994

[30] Foreign Application Priority Data

Dec. 31, 1993 [KR] Rep. of Korea ................ 1993-31912

[51] Int. Cl.$^6$ ............................................. H01L 21/334
[52] U.S. Cl. ............................. 437/44; 437/52; 437/195
[58] Field of Search ................................ 437/195, 228, 437/41, 43, 44, 52

[56] References Cited

U.S. PATENT DOCUMENTS

| | | | |
|---|---|---|---|
| 4,851,365 | 7/1989 | Jeuch | 437/43 |
| 5,264,391 | 11/1993 | Son et al. | 437/195 |
| 5,283,204 | 2/1994 | Rhodes et al. | 437/52 |
| 5,318,925 | 6/1994 | Kim | 437/195 |
| 5,346,844 | 9/1994 | Cho et al. | 437/52 |
| 5,378,641 | 1/1995 | Cheffings | 437/35 |
| 5,413,961 | 5/1995 | Kim | 437/195 |

OTHER PUBLICATIONS

U.S. application No. 08/273,904, Ryou, filed Jul. 12, 1994.
U.S. application No. 08/294,840, Keum et al., filed Aug. 29, 1994.
U.S. application No. 08/297,759, Keum et al., filed Aug. 30, 1994.
U.S. application No. 08/301,623, Ryou, filed Sep. 7, 1994.
U.S. application No. 08/321,623, Bae, filed Oct. 12, 1994.
U.S. application No. 08/323,230, Bae, filed Oct. 14, 1994.
U.S. application No. 08/362,145, Ham, filed Dec. 22, 1994.

*Primary Examiner*—T. N. Quach
*Attorney, Agent, or Firm*—Nath & Associates; Gary M. Nath; Anthony D. Miller

[57] ABSTRACT

A method for fabricating a semiconductor device comprises the steps of depositing polysilicon on a semiconductor substrate for a gate electrode and word line and then depositing insulating oxide layer thickly over the polysilicon. The method forms fine patterns accurately, and forms the contact hole and the gate electrode simultaneously, which prevents short circuit between conductors. The method also reduces the defects or particles which are frequently generated in prior mask and polysilicon and polysilicon spacer processes, so that the reliability and production yield of semiconductor devices may be improved.

5 Claims, 4 Drawing Sheets

METHOD FOR FABRICATING SEMICONDUCTOR DEVICES HAVING LIGHTLY DOPED DRAIN

BACKGROUND OF THE INVENTION

1. Field of the Invention

The present invention relates, to a method for the fabrication of semiconductor devices and, more particularly, using a combination of masks which improve process margin efficiency, thereby improving the reliability and production yield of semiconductor devices.

2. Description of the Prior Art

High integration of semiconductor integrated circuit is always partly based on the solution to the problems about reduction in the unit area of each cell and the process margin limit attributed to a lack in the resolution of processing equipment. The unit area of a chip is drastically reduced with the increase in the integration of semiconductor integrated circuit devices. Accordingly, improving the process margin along with development of highly precise process technique is desperately required to accomplish high integration.

In order to better understand of the background of the present invention, a description will be given for a conventional technology.

FIG. 1A shows a layout of masks used to form a contact of a conventional semiconductor device. As shown in this figure, the layout is composed of a mask for isolation region a, a mask for gate and word line b, a mask for contact hole c, and a mask for second conductor d.

FIG. 1B shows a contact of a semiconductor device in a cross section taken generally through line I—I of FIG. 1A. This conventional contact is generally fabricated as follows:

Initially, on a semiconductor substrate 1, there is formed a field oxide film 2 by use of the mask for isolation region a. A gate oxide 3 is grown, followed by deposition of polysilicon by ion implantation. Taking advantage of the mask for gate electrode and word line b, a pattern of gate electrode and word line 4 is formed. Thereafter, the formation of a MOSFET is completed by forming a source/drain region 6 of lightly doped drain structure. A blanket insulation oxide film 7 is coated on the resulting MOSFET structure in order to separate the devices from one another, followed by deposition of a blanket mask polysilicon layer 8. Using the mask for contact hole mask c of FIG. 2, the mask polysilicon layer 8 and a portion of the isolation oxide film 7 are taken off at a predetermined portion, to form a groove. Then, blanket polysilicon is deposited over the resulting structure and subjected to anisotropic etch, to form a polysilicon spacer 9 at a sidewall of the groove. Using etch selectivity difference between the polysilicon and the insulation oxide film 7, the exposed isolation oxide film 7 is selectively etched to form a contact hole which exposes an area of the source region 6 of the MOSFET therethrough. Following this, a second conducting material is deposited, coming into contact with the active region 6 through the contact hole. The second conducting material is patterned to form an electrode of the second conducting material.

Such conventional structure becomes problematic because in the above-mentioned aspects attributable to the resolution limit of equipments as the degree of integration of semiconductor device is higher.

SUMMARY OF THE INVENTION

It is an object of the present invention is to overcome the above problems encountered in prior systems of this type and to provide a method for fabricating a semiconductor device, capable of improving process margin and improving reliability and production yield.

The objects of the present invention are be accomplished by using a method for the fabricating a semiconductor device, comprising the steps of: growing a field oxide layer a mask using a local oxidation of silicon LOCOS technique on a semiconductor substrate which is provided with a p-well then, depositing a gate oxide layer and a first polysilicon for the gate electrode and word line. Next a pattern of pre-gate electrode is formed by doping the polysilicon with dopants, then depositing an insulation layer on the polysilicon, and etching the insulation layer and the polysilicon by use of the mask of first gate electrode and word line; Next, a first active region of lightly doped drain structure is formed in the p-well by implanting ion impurities at a relatively low density into the semiconductor substrate with the pattern of pre-gate electrode and word line serving as a mask, before depositing a thick insulation film, to cover the first insulation layer, completely. The insulation film is subjected to anisotropic etching to form a first insulation spacer at a side wall of the first pattern of the pre-gate electrode and word line. Ion impurities are implanted at a relatively high density into the semiconductor substrate with both the pattern of pre-gate electrode and word line and the first insulation spacer serving as a mask. A second insulation layer is deposited over the resulting structure, to planarize its surface before forming a photosensitive film pattern on a predetermined area of the second insulation layer by coating a photosensitive film on the second insulation layer, the photosensitive film is exposed to light with a second mask for a second gate electrode and word line and contact, and the photosensitive film is develop. Next, pre-gate electrode and word line polysilicon, is echted to form a contact hole and a gate electrode and word line, simultaneously, with the photosensitive film pattern serving as a mask. A second active region of lightly doped drain structure is formed by implanting ion impurities at a relatively low density through the contact hole into the semiconductor substrate, before depositing a thick insulation layer over the resulting structure. The thick insulation layer is subjected to anisotropic etch, to forming a second insulation layer spacer at a sidewall of the contact hole, and ions are implanted at a relatively high density through narrowed contact hole into the semiconductor substrate. Finally a second is formed by depositing a conductive layer sufficient to fill the contact hole; before etching the conductive layer by use of the mask for the second electrode.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

Figure 1A:
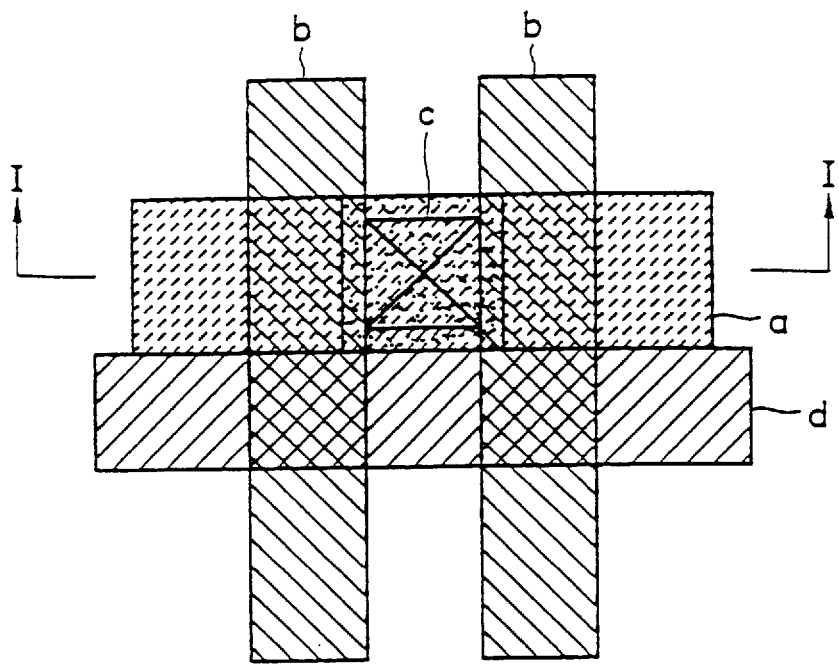
FIG. 1A is a layout showing masks used for fabrication of a conventional semiconductor device.

The preferred embodiments of the present invention are best understood with reference to the accompanying drawings, wherein like reference numerals are used for like and corresponding parts, respectively.

Figure 1B:
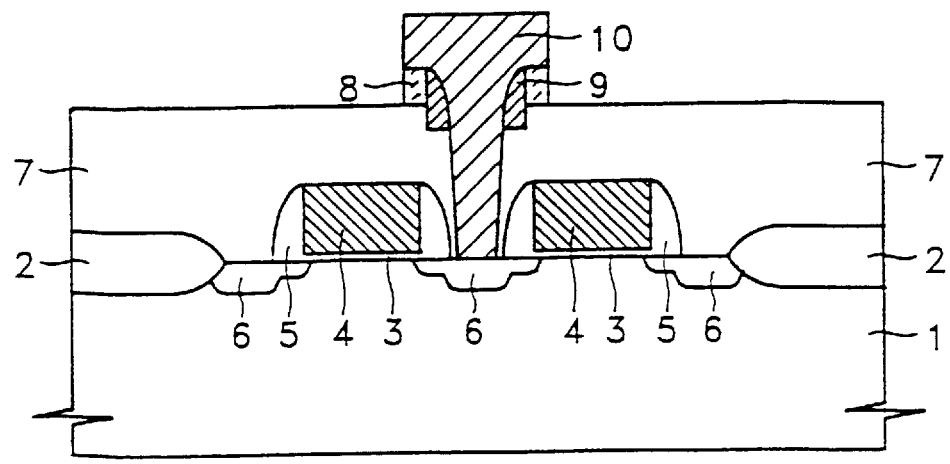
FIG. 1B is a schematic cross sectional view showing a semiconductor device fabricated according to a conventional technique, taken generally through line I—I of FIG. 1A.

FIGS. 1A and 1B each show methods of making conventional semiconductor devices. FIG. 1A is a layout showing masks used for fabricating the conventional semiconductor device, while FIG. 1B is a schematic cross-sectional view showing a semiconductor device which is fabricated according to the conventional technique. The cross-sectional view, as shown, is taken through line I—I of FIG. 1A.

Figure 2:
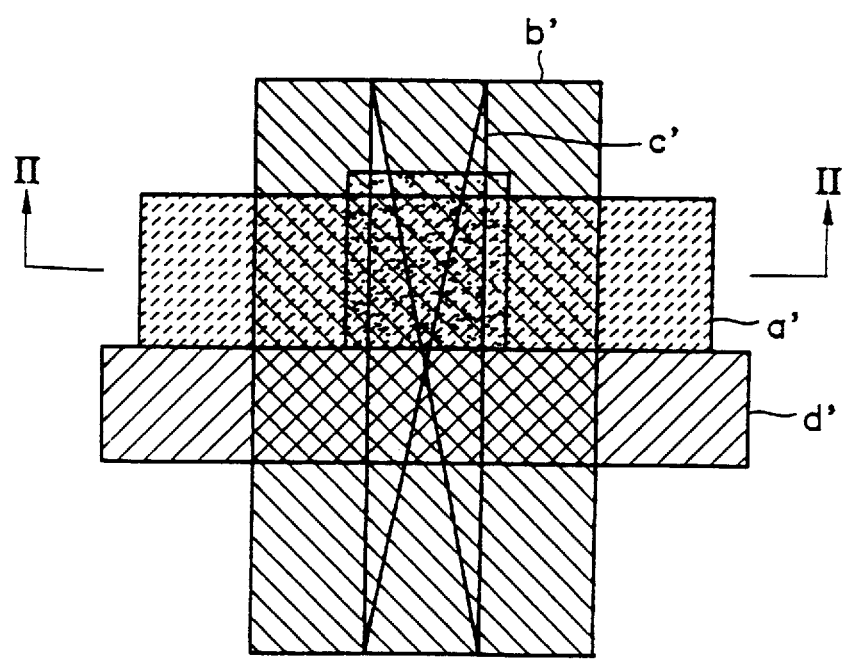
FIG. 2 is a layout showing masks used for fabrication of a semiconductor device according to a first embodiment of the present invention.

FIG. 2 shows a layout of masks used to accomplish the present invention. The layout is composed of a mask for isolation region a', a mask for first gate and word line b', a mask for second electrode and word line and contact hole c', and a mask for second conductive layer electrode d'.

Figure 3A:
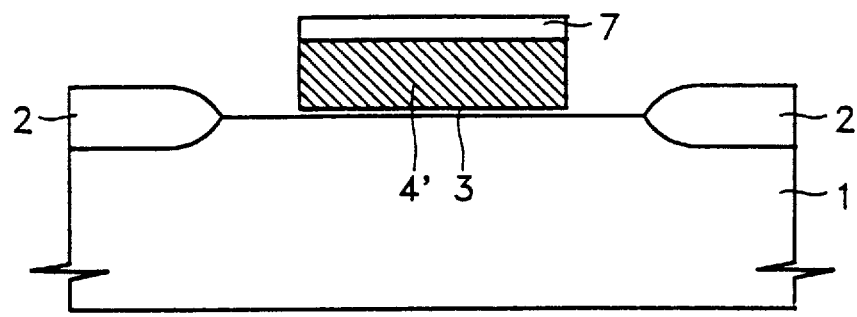
FIGS. 3A through 3C are schematic cross sectional views illustrating a fabrication method of semiconductor device, according to the embodiment of the present invention.
Figure 3B:
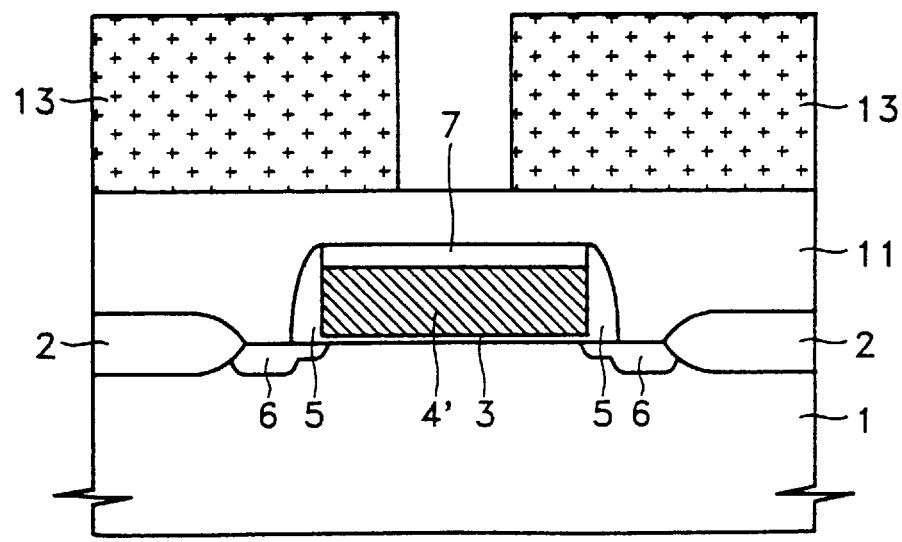
Figure 3C:
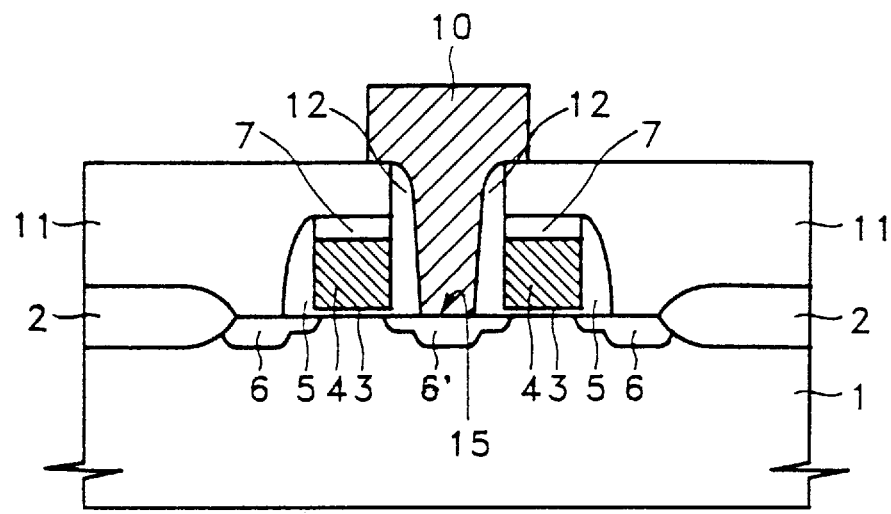

FIG. 3 shows the preferred process steps for fabricating a contact of a semiconductor device, according to the present invention. FIG. 3 shows a cross section taken generally through line II—II of FIG. 2. These preferred process steps will be in great detail described in connection with FIGS. 3A through 3C and FIG. 2.

In detail, FIG. 3A, shows a semiconductor substrate 1 provided with a p-well, where a field oxide 2 is grown in a local oxidation of silicon (hereinafter referred to as "LOCOS") process using the mask for isolation region a'. Subsequently, a gate oxide layer 3 and polysilicon for the gate electrode and word line are quickly deposited, followed by implantation of dopant into the polysilicon. A first insulation layer 7 is deposited at a predetermined thickness. Using the mask for the first gate electrode and word line b', the first insulation layer 7 and the polysilicon are etched to form a pattern of a pre-gate electrode and word line 4'. Deposition of the first insulation layer 7 serves to prevent short circuit between the gate electrode and the second conductive layer which may be caused by excess etching when subsequent formation processes of a contact hole and a gate electrode and word line are conducted.

FIG. 3B is a cross sectional view showing an active region 6 of where a first lightly doped drain (LDD) structure is formed, followed by formation of photosensitive film pattern for a storage electrode. Ions are implanted in the active region 6 of the first LDD structure, at a relatively low density into the semiconductor substrate 1 with the pattern of a pre-gate electrode and word line 4' serving as a mask. Thereafter, an insulation film is deposited at a predetermined thickness and then subjected to anisotropic etching, to form a first insulation spacer. Ion implantation of relatively high density accomplishes the formation of the active region of first LDD structure with the first insulation spacer serving as a mask. As to the photosensitive film pattern, a blanket second insulation oxide layer 11 is deposited, and a photosensitive film is applied to the blanket second insulation pattern 11, illuminated with light by use of the mask c' for the second gate electrode and word line and contact, and then developed to form a photosensitive film pattern 13. It should be noted that the ion implantation of relatively high density may be omitted so as to increase the threshold voltage and the prevent leak current between adjacent active regions and hot carrier phenomenon.

FIG. 3C shows a cross sectional view after an active region 6 of second LDD structure is formed, followed by formation of contact. First, with regard to the active region of second LDD structure, the contact is formed by etching the second insulation layer 11 and the pre-gate electrode and word line polysilicon 4 to form a contact hole 15 and a gate electrode and word line 4, at the same time, with the photosensitive film pattern 13 serving as a mask, implanting ions at a relatively low density through the contact hole 15 into the semiconductor substrate 1, depositing a thick insulation layer, subjecting the thick insulation layer to anisotropic etch to form a second insulation layer spacer 12 at a sidewall of the contact hole, and implanting ions at a relatively low density into the semiconductor substrate 1. As to the contact, a second conductive layer is deposited in such a thickness as to fill the contact hole and then etched by use of the mask d', to achieve the contact.

Figure 4:
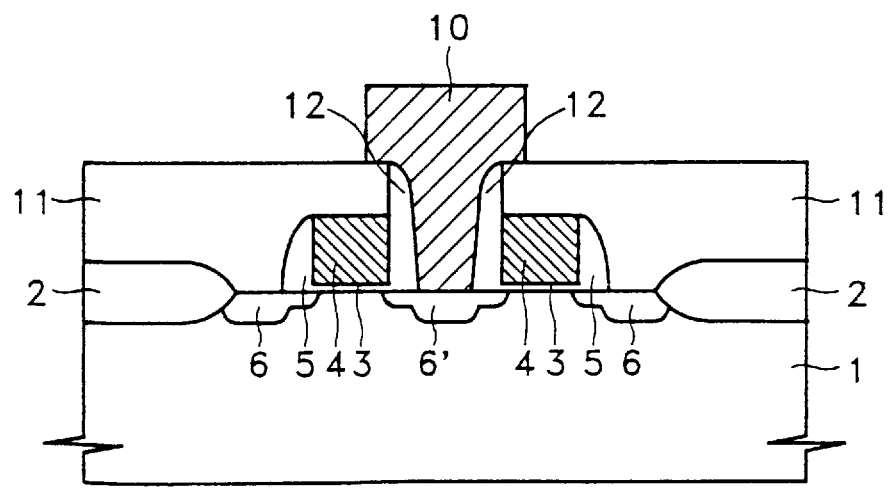
FIG. 4 is a schematic cross sectional view showing a semiconductor device according to a second embodiment.

FIG. 4 is a cross sectional view showing a contact, according to another embodiment of the present invention. The contact is achieved by omitting the deposition of the first insulation layer 7 of FIG. 3 with the aim of simplification of process.

As apparent from the above-mentioned description, the present method is capable of forming more fine patterns with current equipment and technologies that the prior arts are. Accordingly, the present method can efficiently cope with reduction in unit area, a requisite phenomenon for the higher integration of semiconductor devices. In addition, the contact hole and the gate electrode are formed, simultaneously according to the present method which prevents short circuit between conductors, attributable to a lack of process margin. Furthermore, the present method is able to reduce the defects or particles which are frequently generated in prior mask polysilicon and polysilicon spacer processes, so that reliability and production yield of semiconductor devices may be improved.

Other features, advantages and embodiments of the invention disclosed herein will be readily apparent to those exercising ordinary skill in the art after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a semiconductor device, comprising the steps of:

growing a field oxide layer by use of a mask for isolation region in a local oxidation of silicon manner on a semiconductor substrate provided with a p-well and depositing a gate oxide layer and a first polysilicon for gate electrode and word line, in sequence, without time delay;

forming a pattern for pre-gate electrode by doping the polysilicon with dopants, depositing a first insulation layer on said polysilicon, and etching the first insulation layer and the polysilicon by use of a mask of first gate electrode and word line;

forming a first active region of lightly doped drain structure in the p-well by implanting ion impurities at a relatively low density into the semiconductor substrate with the pattern for a pre-grate electrode and word line serving as a mask, depositing a thick insulation film, to cover the first insulation layer completely, subjecting the insulation film to anisotropic etching to form a first insulation spacer at a side wall of the first pattern for a pre-gate electrode and word line, and implanting ion impurities at a relatively high density into the semiconductor substrate with both the for a pre-gate electrode and word line and the first insulation spacer serving as a masks;

depositing a second insulation layer over the resulting structure, to planarize its surface;

forming a photosensitive film pattern on a predetermined area of said second insulation layer by coating a photosensitive film on the second insulation layer, exposing photosensitive film to light with a second mask for second gate electrode and word line and contact and developing the photosensitive film;

etching the pre-gate electrode and word line polysilicon, to form a contact hole and a gate electrode and word line, simultaneously, with the photosensitive film pattern serving as a mask;

forming a second active region of lightly doped drain structure by implanting ion impurities at a relatively low density through the contact hole into the semiconductor substrate, depositing a thick insulation layer over the resulting structure, subjecting the thick insulation layer to anisotropic etching, to forming a second insulation layer spacer at a sidewall of the contact hole, and implanting ions at a relatively high density through narrowed contact hole into the semiconductor substrate; and forming a second electrode by depositing a conductive layer at a thickness sufficient to fill the contact holes, and then etching the conductive layer by use of the mask for said second electrode.

2. A method in accordance with claim 1, wherein said second mask for gate electrode and word line and said contact is patterned to form a contact hole and an electrode, at same time.

3. A method in accordance with claim 1, wherein said active regions of lightly doped drain structure are formed without implanting ion impurities at a relatively high density, whereby threshold voltage can be raised and leak current and hot carrier between adjacent active regions can be prevented.

4. A method in accordance with claim 1, wherein said conductive layer comprises impurity-doped polysilicon and said active regions of lightly doped drain structure are formed without implanting ion impurities at a relatively high density, whereby the impurities doped in the polysilicon may be diffused.

5. A method for fabricating a semiconductor device, comprising the steps of:

growing a field oxide layer by use of a mask for isolation region in a local oxidation of silicon manner on a semiconductor substrate provided with a p-well and depositing a gate oxide layer and a first polysilicon for a gate electrode and word line, in sequence, without time delay;

forming a pattern for a pre-gate electrode by doping the polysilicon with dopants, and etching the polysilicon by use of a mask of said first gate electrode and word line;

forming a first active region of lightly doped drain structure in the p-well by implanting ion impurities at a relatively low density into the semiconductor substrate with the pattern for a pre-gate electrode and word line serving as a mask, depositing a thick insulation film, anisotropic etching to form a first insulation spacer at a side wall of said first pattern for a pre-gate electrode and word line, and implanting ion impurities at a relatively high density into the semiconductor substrate with both the pattern for a pre-gate electrode and word line and the first insulation spacer serving as a mask;

depositing a second insulation layer over the resulting structure, to planarize its surface;

forming a photosensitive film pattern on a predetermined area of said second insulation layer by coating a photosensitive film on the second insulation layer, exposing photosensitive film to light with a second mask for second gate electrode and word line and contact and developing the photosensitive film;

etching the pre-gate electrode and word line polysilicon, to form a contact hole and a gate electrode and word line, simultaneously, with the photosensitive film pattern serving as a mask;

forming a second active region of lightly doped drain structure by implanting ion impurities at a relatively low density through the contact hole into the semiconductor substrate, depositing a thick insulation layer over the resulting structure, subjecting the thick insulation layer to anisotropic etching, to form a second insulation layer spacer at a sidewall of the contact hole, and implanting ions at a relatively high density through narrowed contact hole into the semiconductor substrate; and forming a second electrode by depositing a conductive layer at a thickness sufficient to fill the contact hole, and then etching the conductive layer by use of the mask for said second electrode.

* * * * *